United States Patent
Tran

(10) Patent No.: US 8,395,446 B1
(45) Date of Patent: Mar. 12, 2013

(54) DUAL-MODE AMPLIFIER

(75) Inventor: Toan D. Tran, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 498 days.

(21) Appl. No.: 12/692,105

(22) Filed: Jan. 22, 2010

Related U.S. Application Data

(60) Provisional application No. 61/148,923, filed on Jan. 31, 2009, provisional application No. 61/148,930, filed on Jan. 31, 2009.

(51) Int. Cl.
  *H03F 3/45* (2006.01)
(52) U.S. Cl. ......................... 330/254; 330/261
(58) Field of Classification Search .............. 330/253, 330/254, 261
  See application file for complete search history.

(56) References Cited

U.S. PATENT DOCUMENTS

| | | | |
|---|---|---|---|
| 6,278,321 B1 * | 8/2001 | Franck | 330/254 |
| 7,215,196 B2 * | 5/2007 | Banba et al. | 330/254 |
| 7,532,070 B2 * | 5/2009 | Cowley et al. | 330/254 |

OTHER PUBLICATIONS

Payne, Robert et al., "A 6.25—Gb/s Binary Transceiver in 0.13-μm CMOS for Serial Data Transmission Across High Loss Legacy Backplane Channels," IEEE Journal of Solid-State Circuits, vol. 40, No. 12, Dec. 2005, pp. 2646-2657.

* cited by examiner

*Primary Examiner* — Henry Choe
(74) *Attorney, Agent, or Firm* — W. Eric Webostad

(57) ABSTRACT

Method and apparatus for amplification in an IC are described. A dual mode isolation amplifier having two modes of operation is provided. In the first mode of operation for a resistor-loaded differential transconductance with additional gain, a first switch circuit is placed in a substantially nonconductive state for electrically decoupling from a first current source node and a second current source node. A second switch circuit is placed in a substantially conductive state for electrically coupling a capacitor thereof to the first current source node and the second current source node. At high frequencies, a first resistance associated with the capacitor coupled in parallel with a resistive load is substantially reduced. The resistive load is coupled between the first current source node and the second current source node. The first resistance is reduced by approximating a short circuit by the capacitor during high-frequency operation.

10 Claims, 9 Drawing Sheets

DUAL-MODE AMPLIFIER

CROSS-REFERENCE TO RELATED APPLICATIONS

This application claims benefit of U.S. Provisional Patent Application having the Application No. 61/148,923 filed on Jan. 31, 2009 and entitled "Multi-Gigabit Transceiver"; and also U.S. Provisional Patent Application having the Application No. 61/148,930 filed on Jan. 31, 2009 and entitled "Architecture for Advanced Integrated Circuit Providing High Performance." Both of these provisional patent applications are incorporated herein by reference in their entirety.

FIELD OF THE INVENTION

An embodiment of the invention relates to integrated circuit devices ("ICs"). More particularly, an embodiment of the invention relates to amplification in an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

A receiver or a transceiver of an FPGA or other IC may employ a receiver analog front end ("RXAFE") amplifier coupled to an adaptive decision feedback equalizer ("DFE") via an isolation amplifier. Additional details regarding such a DFE and amplifiers may be found in an article entitled "A 6.25-Gb/s Binary Transceiver in 0.13-μm CMOS for Serial Data Transmission Across High Loss Legacy Backplane Channels," by Robert Payne, et al., IEEE Journal of Solid-State Circuits, vol. 40, no. 12, published December 2005 at pages 2646-2657 (the "Payne Article").

In the Payne Article, a conventional isolation amplifier has an output that is fed to taps of a DFE. Such a conventional isolation amplifier provides a resistor-loaded differential transconductor. However, such a conventional isolation amplifier limits equalized signaling from the RXAFE amplifier.

Accordingly, it would be desirable and useful to provide means that overcomes this limitation of a conventional isolation amplifier.

SUMMARY OF THE INVENTION

One or more embodiments generally relate to amplification in an IC.

An embodiment relates generally to a method for amplification. In such an embodiment, a dual mode isolation amplifier having a first mode of operation and a second mode of operation is provided. In the first mode of operation, the method includes operating with a resistor-loaded differential transconductance with additional gain. A first high-pass control signal is deasserted and a second high-pass control signal is asserted. A first switch circuit is placed in a substantially nonconductive state for electrically decoupling from a first current source node and a second current source node. A second switch circuit is placed in a substantially conductive state for electrically coupling a capacitor thereof to the first current source node and the second current source node. At high frequencies, a first resistance associated with the capacitor coupled in parallel with a resistive load is substantially reduced. The resistive load is coupled between the first current source node and the second current source node. The first resistance is reduced by approximating a short circuit by the capacitor during high-frequency operation.

Another embodiment relates generally to an apparatus for amplification. In such an embodiment, the apparatus for amplification includes an isolation amplifier circuit; a gain boost circuit coupled to the isolation amplifier circuit at a first current source node and a second current source node; and a current source module coupled to the isolation amplifier circuit and the gain boost circuit at the first current source node and the second current source node.

Yet another embodiment relates generally to a decision feedback equalizer. In such an embodiment, the decision feedback equalizer can include a receiver analog front end circuit coupled to receive an incoming signal and configured to provide a buffered version of the incoming signal by providing gain. A first dual mode isolation amplifier is coupled to receive the buffered version of the incoming signal and configured to operate with a first resistor-loaded differential transconductance with additional gain in a first mode of operation and with a second resistor-loaded differential transconductance without the additional gain in the second mode of operation. The first dual mode isolation amplifier provides a first boost of equalization responsive to the additional gain in the first mode.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
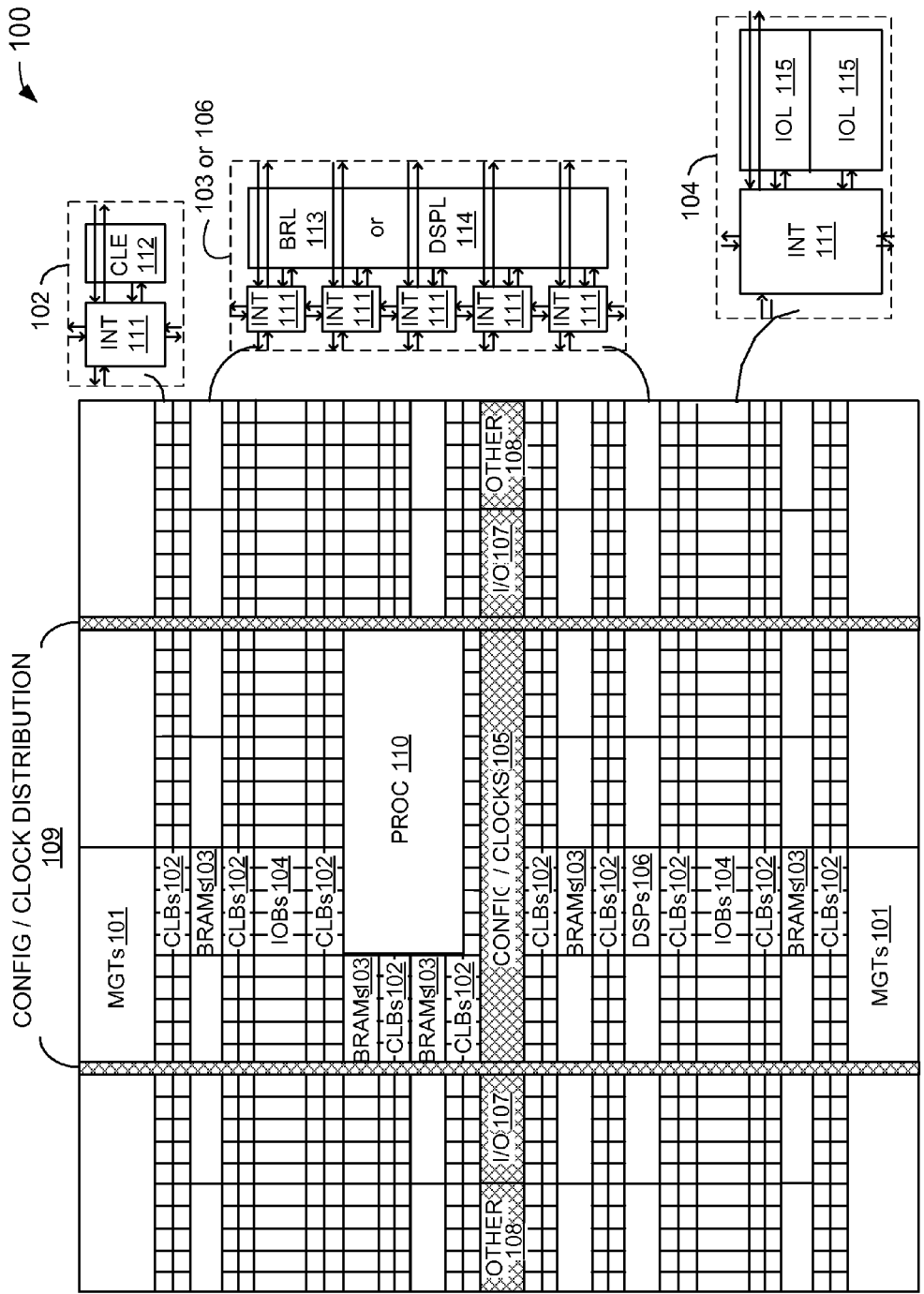
FIG. 1 is a block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

As described below in additional detail, gigabit transceivers ("GTs"), which may be MGTs 101 of FIG. 1, are individually or in combination used to provide high data rates of communication. For example, an IC may have eight GTs operating in combination for gigabyte communication. However, other numbers of GTs operating in combination may be used.

For example, each GT may be capable of operating at a data rate between approximately 155 megabits per second ("Mb/s") and approximately 6.5 gigabits per second ("Gb/s"). However, other bit rates may be used. A transmitter and a receiver of a GT may be independent circuits that use separate phase-lock loops ("PLLs") to multiply a reference frequency input by programmable numbers, where such programmable numbers range between approximately 2 and approximately 25.

The result of the multiplication of such reference frequency by a programmable number results in a bit-serial data clock. In another embodiment, a transmitter and a receiver of a GT may optionally share a PLL.

User definable features and parameters of a GT may be defined during configuration of an FPGA, even though such a GT is a dedicated circuit in such FPGA. Furthermore, such GT user-definable features and parameters may be modified during operation of such FPGA. Even though GTs are described in terms of being a dedicated circuit block within an FPGA, it should be appreciated that GTs described herein may be embedded in other types of ICs.

A transmitter of a GT includes a parallel-to-serial converter with a conversion ratio which is user definable. Example conversion ratios that may be set are 1 serial to 8, 10, 16, 20, 32, or 40 parallel.

A GT transmitter output may be used to drive a printed circuit board ("PCB"), with a single-channel differential current-mode logic ("CML") output signal. A transmitter clock output may be a bit-serial data clock which is divided responsive to a conversion ratio. Such a transmit output clock may be used to directly register parallel data coming from internal logic, such as field programmed programmable logic gates of an FPGA. Such incoming parallel data to a GT transmitter may be fed through a first-in, first-out buffer ("FIFO"). Optionally, incoming parallel data to a transmitter may be line encoded. Examples of line encodings that may be used are an 8-bit/10-bit line code for mapping 8 bit symbols to 10 bit symbols in order to provide a sufficient number of transitions. Other examples of line codes include a 64-bit/66-bit line code and a 64-bit/67-bit line code. Even though these known line code examples are described, it should be appreciated that other types of line codes may be used.

For a GT transmitter, a bit-serial output signal may be used to drive two package pins of an FPGA IC with complementary CML signals. Such an output signal pair may have a programmable signal swing, as well as a programmable pre-emphasis, for compensation of PCB loses and/or other signal distortions associated with interconnects and signal transmission from transmitter to receiver.

A GT receiver includes a serial-to-parallel converter. This allows a GT receiver to change an incoming bit serial differential signal into a parallel stream of words. Such words may have any of a variety of user programmable bit widths. For example, bit widths may be 8, 10, 16, 20, 32, or 40 bits wide. A GT receiver may include a programmable equalizer to compensate for PCB and/or other signal distortions associated with interconnects and signal transmission from transmitter to receiver. Accordingly, an incoming differential data stream may be fed through such a programmable equalizer for such compensation.

As previously described, a shared PLL or separate PLLs may be used to multiply a reference frequency input by any of a select number of programmable numbers, such as between approximately 2 and approximately 25. Additionally, such reference frequency input may be used to initiate clock recognition for a receive clock, such that no separate clock line or pin need be provided.

The data pattern for transmit and received data may be a non-return-to-zero ("NRZ") form or NRZ-inverted ("NRZI") form of voltage level signaling. Optionally, sufficient data transitions may be provided by using a selected encoding scheme, such as the reverse of one of the line codes previously described. From a GT receiver, parallel data may be transferred into FPGA internal logic using a receiver user clock signal. A serial-to-parallel conversion ratio may be as previously described.

GT transceivers may be used to provide out-of-band ("OOB") signaling. OOB signaling may be used to send low speed signals from a transmitter to a receiver, such as from one GT to another GT when high-speed serial data transmission is not active. Such OOB signaling may be used when a link is in a powered down state or has not been initialized. Accordingly, such OOB signaling may be used to initialize a high-speed serial data link. As will be appreciated from the following description, GTs may be provided as a modular building block for system design of a transceiver interface, where such designed system is implemented in an FPGA or other IC.

Figure 2:
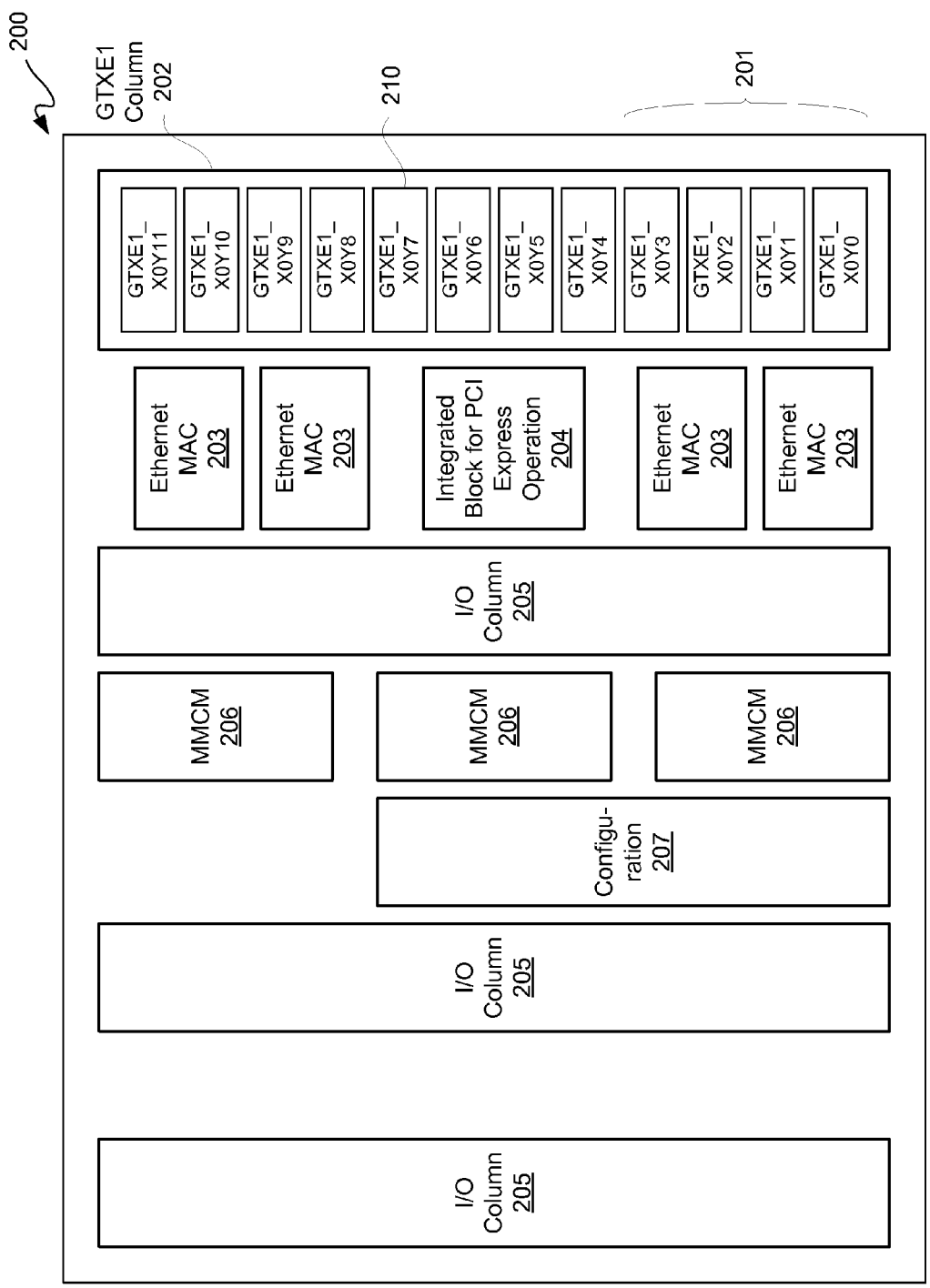
FIG. 2 is a block diagram depicting another exemplary embodiment of an FPGA.

FPGA 100 of FIG. 1 may have a column of GT transceivers such as MGT transceivers 101 of FIG. 1. Alternatively, referring to FIG. 2, there is shown a block diagram depicting an exemplary embodiment of an FPGA 200. FPGA 200 includes IO columns 205, Ethernet Media Access Controllers 203, an integrated block for PCIe operation 204, a GT column 202, a configuration block 207, and clock modules ("MMCMs") 206.

Position of a GT transceiver 210 of GT column 202 is specified by an x/y coordinate system for describing a column number and its relative position within that column. GT transceiver and clocking resources of an FPGA instantiated design may be mapped to available locations with a user constraints file ("UCF") (not shown). By defining locations of GT transceivers early in a design process, correct usage of clock resources may be facilitated, as well as facilitating signal integrity analysis during board design. Thus an implementation flow facilitates such locating of GT transceivers by use of location constraints in a UCF.

GTs 210 have dedicated clock routing and multiplexer resources. GTs 210 may be grouped in groups, such as two or four for example. An example of a grouping of four GTs 201 includes four GTXE primitives, two dedicated reference lock pin pairs, and dedicated reference clock routing is termed a "Quad," namely Quad 201. The referenced clocks of Quad 201 may be used by any of the four GTXE primitives and may be routed to top or bottom adjacent GTXE primitives using the dedicated reference clock routing.

Figure 3:
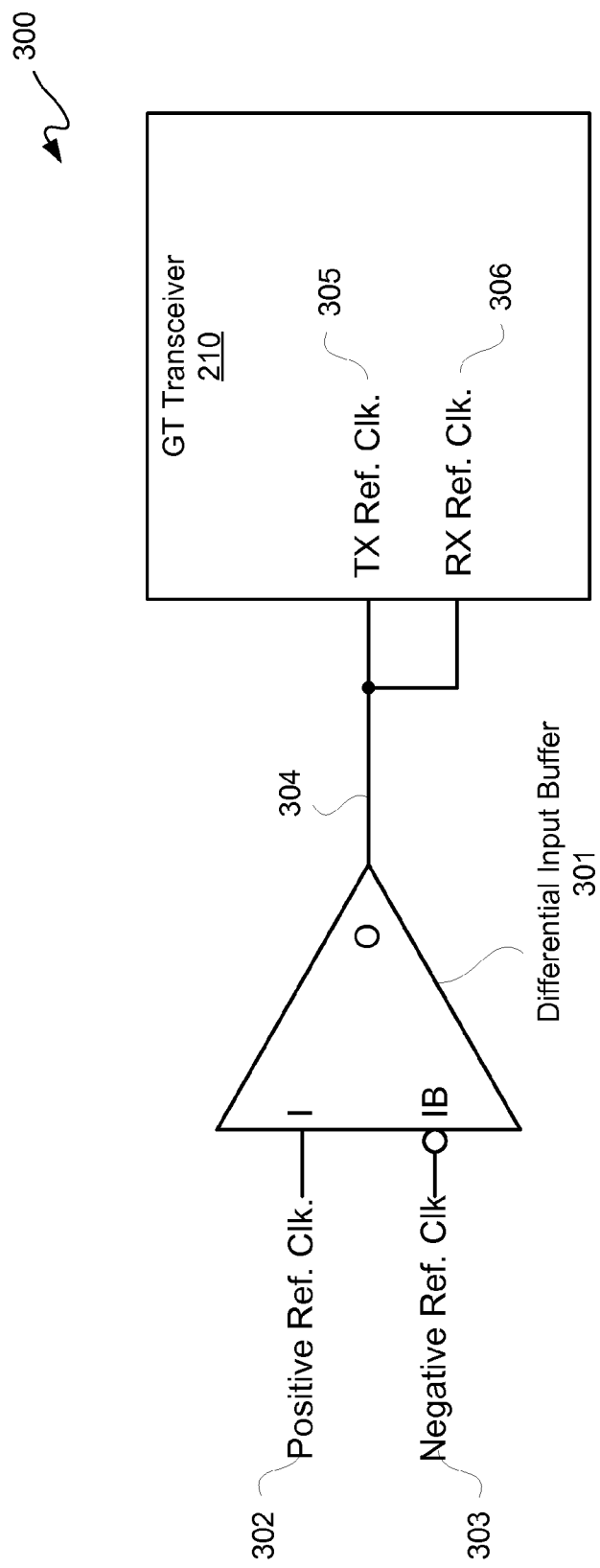
FIG. 3 is a block/circuit diagram depicting an exemplary embodiment of a single external reference clock configuration.

FIG. 3 is a block/circuit diagram depicting an exemplary embodiment of a single external reference clock configuration 300. A differential input buffer 301 is instantiated and coupled to receive positive and negative reference clocks 302 and 303, respectively, for providing a reference clock 304. Reference clock 304 is provided to a dedicated reference clock pin pair for input of a transmit ("TX") reference clock 305 and a receive ("RX") reference clock 306 of a GT transceiver 210.

As previously described, a GT may have one TX PLL and one RX PLL. TX and RX datapaths are capable of operating asynchronously using different reference clock inputs, where asynchronous signals are input. In another embodiment, TX and RX datapaths optionally can operate using a same line rate range, where an RX PLL can be shared between TX and RX datapaths and the TX PLL can be powered down.

Figure 4:
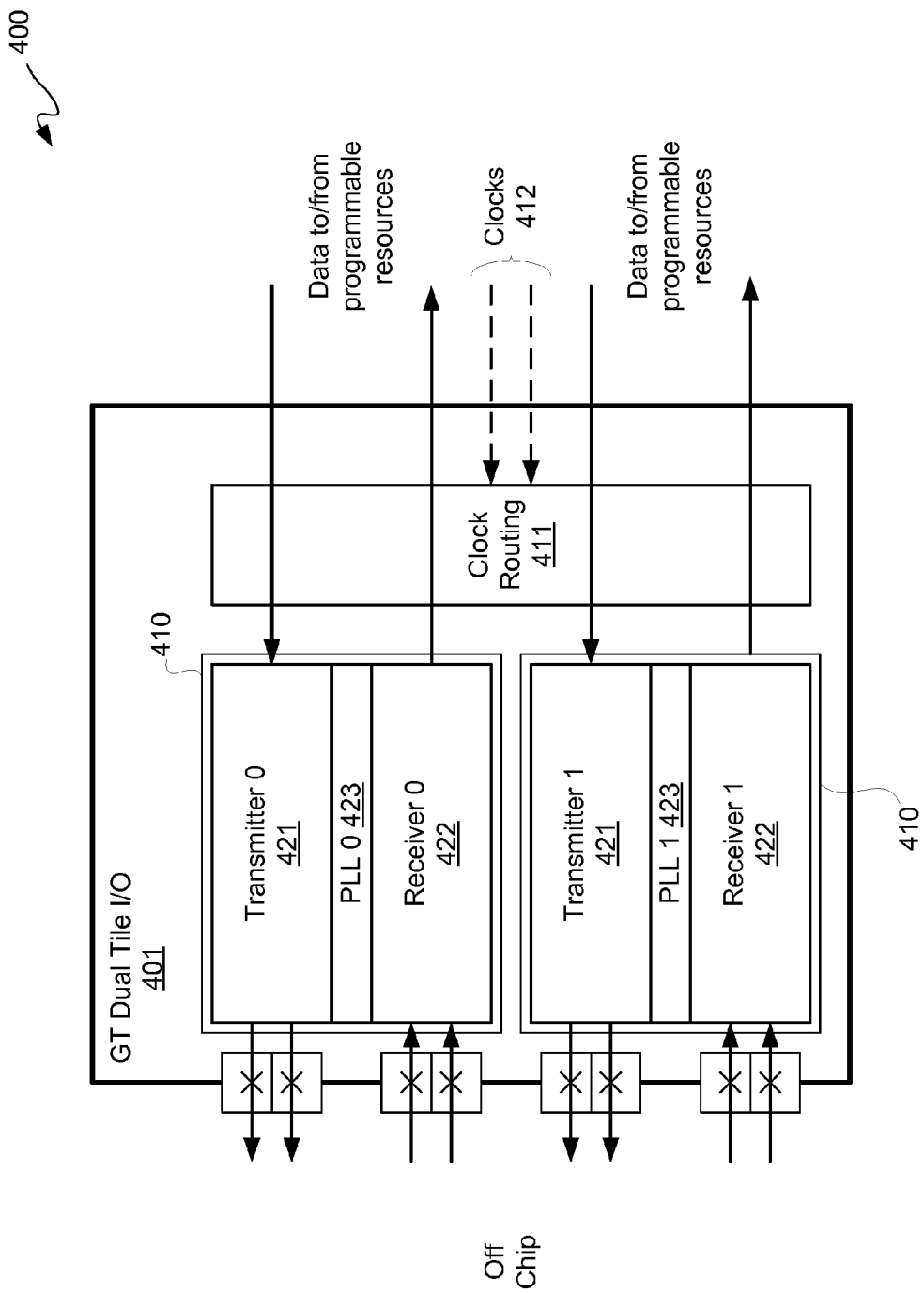
FIG. 4 is a block diagram depicting an exemplary embodiment of gigabit transceivers ("GTs") architecture.

FIG. 4 is a block diagram depicting an exemplary embodiment of a GT architecture 400. GT architecture 400 includes a GT dual tile I/O 401 having a grouping of two GT primitives 410 and a dedicated clock routing block 411. Each GT primitive 410 includes a transmitter 421, a PLL 423, and a receiver 422.

Even though a grouping of two GT primitives is illustratively shown, it should be appreciated that GT primitives may be grouped in a grouping larger than two, such as four for example. Each GT primitive 410 may be configured in one of two modes of operation. In a first mode of operation, TX and RX sides of each GT primitive 410 have one independent PLL for a total of two active PLLs for each tile 401. In a second mode of operation, TX and RX sides of both GT primitives 410 share one PLL and the second PLL of tile 401 is powered down for power savings.

Each GT primitive 410 may select from one of two reference clock inputs 412 from an FPGA. A PLL may have a nominal operating range between approximately 1.5 GHz and approximately 3.25 GHz for supporting a line rate range of approximately 3.0 to 6.5 Gb/s. However, other frequencies and bit rates may be used. A PLL output may be divided down by two or four using a clock dividers block to support a line rate range of approximately 1.5 to 3.25 Gb/s or approximately 0.75 to 1.625 Gb/s, respectively. Lower line rates may be obtained with use of an oversampling block of GT transceiver 210, where up to 5× oversampling may be obtained.

Figure 5:
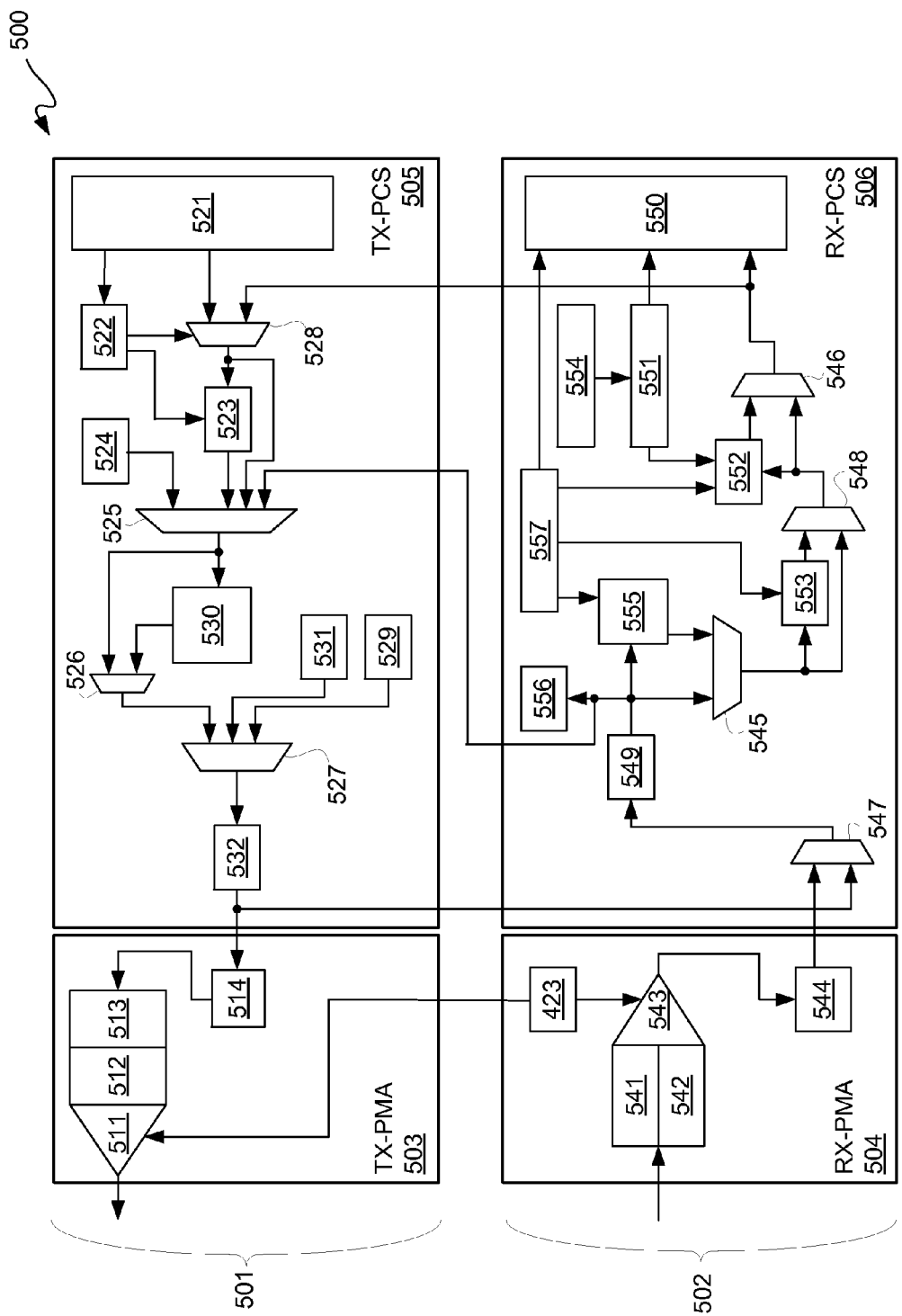
FIG. 5 is a functional block diagram depicting an exemplary embodiment of a gigabit transceiver ("GT") with transmit and receive data paths.

With reference to FIG. 5, there is shown a functional block diagram depicting an exemplary embodiment of a GT 500 with transmit and receive datapaths 501 and 502, respectively. GT 500 includes a TX-physical medium attachment ("PMA") block 503, a TX-physical coding sublayer ("PCS") block 505, an RX-PMA block 504, and an RX-PCS block 506. TX and RX sides of GT 500 each support one-, two-, and four-byte interfaces to FPGA logic.

TX-PMA block 503 includes a driver 511, an OOB and Peripheral Component Interconnect Express ("PCIe") block 512, a pre-/post-emphasis block 513, and a parallel-input-serial-output buffer ("PISO") 514. TX-PMA block 503 is used in part to provide programmable pre-emphasis and post-emphasis to enhance signal integrity. Additionally, TX-PMA block 503 includes OOB and PCIe capabilities. Depending on whether an 8b/10b TX PCS is used, a byte may be 8 or 10 bits. A TX user clock may be used to facilitate alignment with a transmit FPGA datapath via FPGA TX interface 521.

TX-PCS block 505 includes FPGA TX interface 521, pipeline controller 522, encoder 523, pattern generator 524, multiplexers 525 through 528, serial AT attachment ("SATA")/OOB block 529, phase adjust first-in-first-out buffer ("FIFO") 530, PCIe beacon block 531, and polarity block 532. Output from polarity block 532 is provided as in input to PISO 514 and as a parallel data input to multiplexer 547 of RX-PCS block 506 for a near-end PCS loopback.

RX-PMA block 504 includes a programmable equalizer 541, an OOB block 542, a clock data recovery driver ("CDR") 543, a PLL 423, and a serial-input-parallel-output buffer ("SIPO") 544. RX-PMA block 504 supports programmable RX equalization to enhance signal integrity. Additionally, RX-PMA block 504 supports OOB communication. Again, depending on whether an 8b/10b RX PCS is used, a byte may be 8 or 10 bits. An RX user clock may be used to facilitate alignment with a receive FPGA datapath via FPGA RX interface 550.

RX-PCS block 506 includes multiplexers 545 through 548, a polarity block 549, an FPGA RX interface 550, a status controller 551, an elastic buffer 552, a decoder 553, a pipeline controller 554, a comma detect and alignment block 555, a pattern checker 556, and a loss of synchronization ("sync") block 557. Output from polarity block 549 is provided as a parallel data input to multiplexer 525 of TX-PCS block 505 for a far-end PMA loopback, as well as being provided to multiplexer 545, comma detect and alignment block 555, and pattern checker 556 within RX-PCS block 506. Output from multiplexer 546 is provided as a parallel data input to multiplexer 528 of TX-PCS block 505 for a far-end PCS loopback.

FIGS. 1 through 5 provide a context in which a dual-mode amplifier may be implemented for RX equalization. However, it shall be appreciated from the following description that a dual-mode amplifier as described herein may be employed in any application where additional gain is to be provided in one mode and not provided in another mode.

Figure 6:
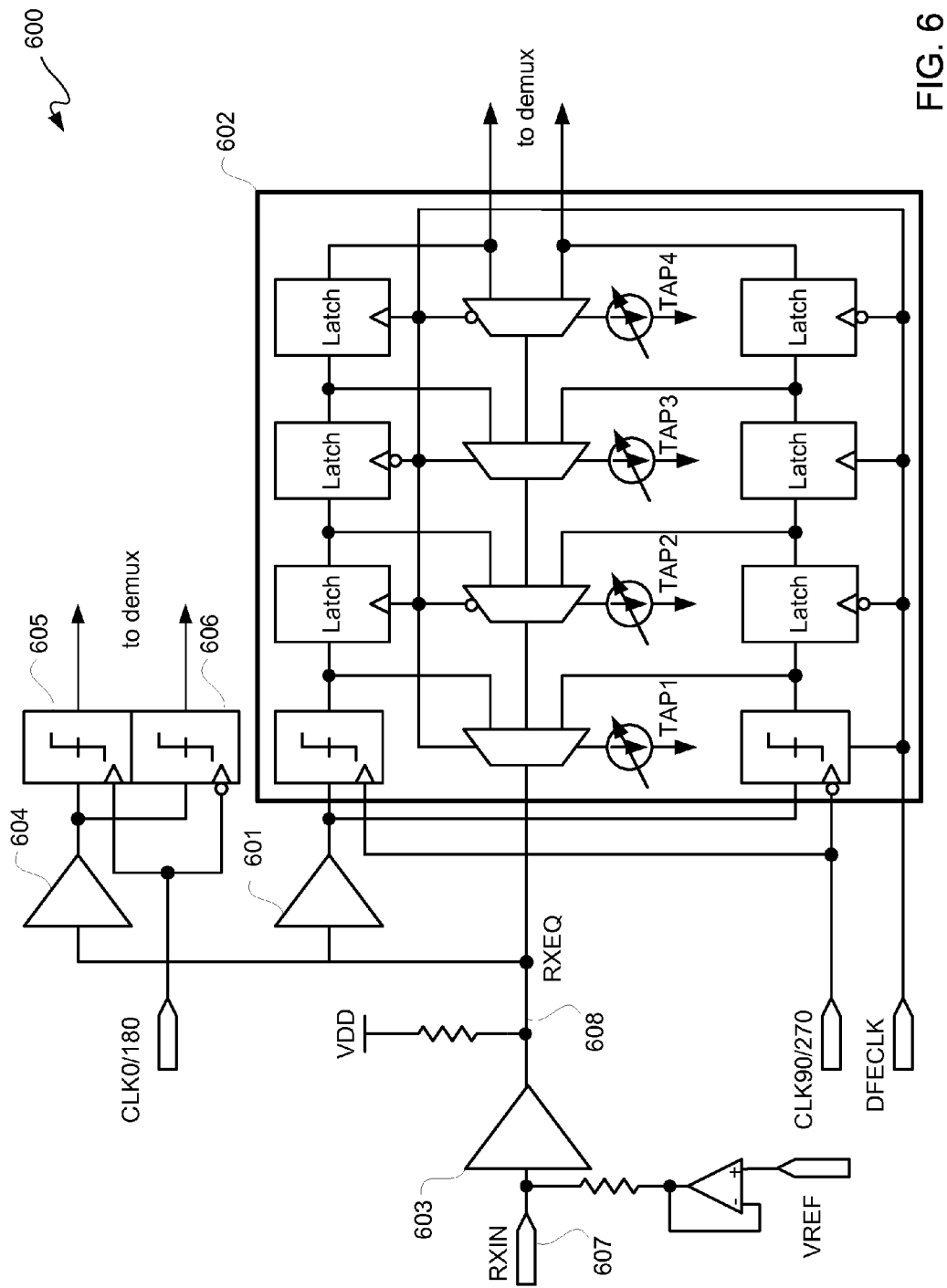
FIG. 6 is a block/circuit diagram depicting an exemplary embodiment of a receiver equalization block.

FIG. 6 is a block/circuit diagram depicting an exemplary embodiment of an RX equalization block 600. As shall be described in additional detail below, RX equalization block 600 may be part of RX-PMA block 504 of a receive path 502 of FIG. 5. RX equalization block 600 includes a receiver analog front end ("RXAFE") amplifier 603 coupled to an adaptive decision feedback equalizer ("DFE") 602 via a dual-mode isolation amplifier 601. Another isolation amplifier 604 may be coupled to receive output from RXAFE amplifier 603 for providing sampling clock signaling via flip-flops 605 and 606.

In order to compensate for more than 20 dB channel loss in legacy communication equipment backplanes, a receiver may use a half baud rate, four-tap DFE 602 as illustratively depicted in FIG. 6. Amplifiers 603 and 601 are used prior to DFE 602 input slicers. Amplifier 603 buffers an incoming signal RXIN 607 to provide an equalized signal RXEQ 608. Amplifier 603 provides some gain, such as approximately 6 dB, and minimizes parasitic capacitance associated with input pads at which signal RXIN 607 is received to improve return loss and bandwidth.

Again, as indicated hereinabove, a conventional isolation amplifier, such as isolation amplifier 700 of FIG. 7, limits equalized signal from amplifier 603, namely limits equalized signal RXEQ 608. To overcome this limitation, isolation amplifier 700 of FIG. 7 is replaced with a dual-mode isolation amplifier as described below in additional detail with reference to FIG. 8.

Figure 8:
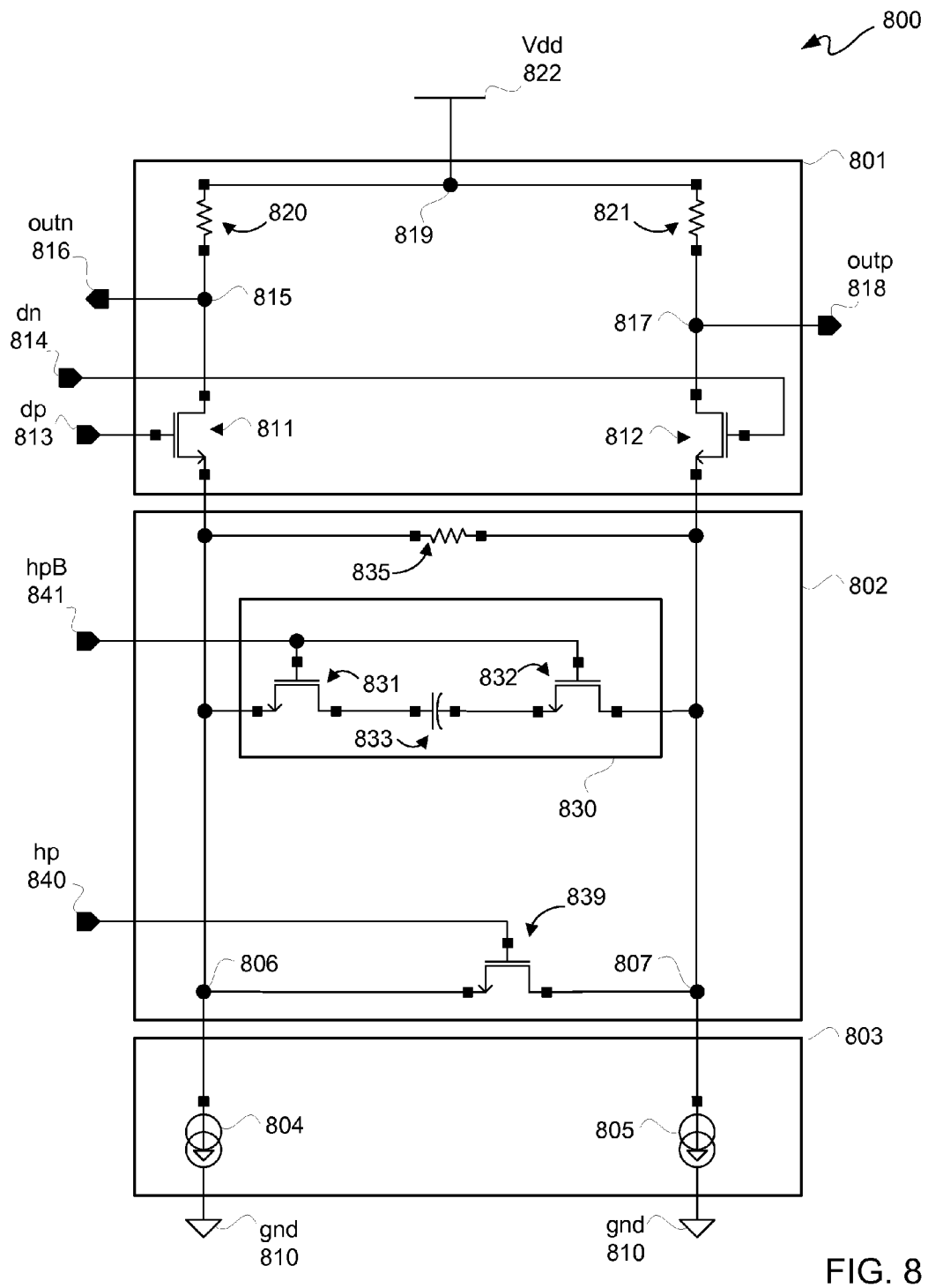
FIG. 8 is a block/circuit diagram depicting an exemplary embodiment of a dual mode isolation amplifier.

FIG. 8 is a block/circuit diagram depicting an exemplary embodiment of a dual mode isolation amplifier 800. Isolation amplifier 800 may be used as isolation amplifier 601 of FIG. 6, and optionally may be used as isolation amplifier 604 also of FIG. 6. Amplifier 601 is used to aid in common mode rejection of sense amplifiers of DFE 602 and to isolate charge kickback generated among such sense amplifiers. Amplifiers 604 and 601 may be configured the same, namely both may be dual-mode amplifiers as described below herein. Isolation amplifier 800 includes an isolation amplifier circuit 801 coupled to a current source module 803 via a gain boost circuit 802. Even though n-type transistors are illustratively depicted, it should be understood that p-type or a combination of n-type and p-type transistors may be used.

Transistors 811 and 812, resistors 820 and 821, and nodes 815, 817, and 819 are of isolation amplifier circuit 801. A drain of transistor 811 is connected to current source node 806, and a drain of transistor 812 is connected to current source node 807. Transistors 811 and 812 are n-type transistors. A data positive signal ("dp") 813 gates transistor 811, and a data negative signal ("dn") 814 gates transistor 812. A source node of transistor 811 is connected to a negative output node 815 for providing a negative side output signal ("outn") 816, and an output node 817 is connected to a source node of transistor 812 for providing a positive side output signal ("outp") 818. Output nodes 815 and 817 may be coupled to one another by resistors 820 and 821, which resistors are connected to one another at supply node 819. Supply node 819 may be connected to a supply voltage, such as Vdd 822.

Figure 7:
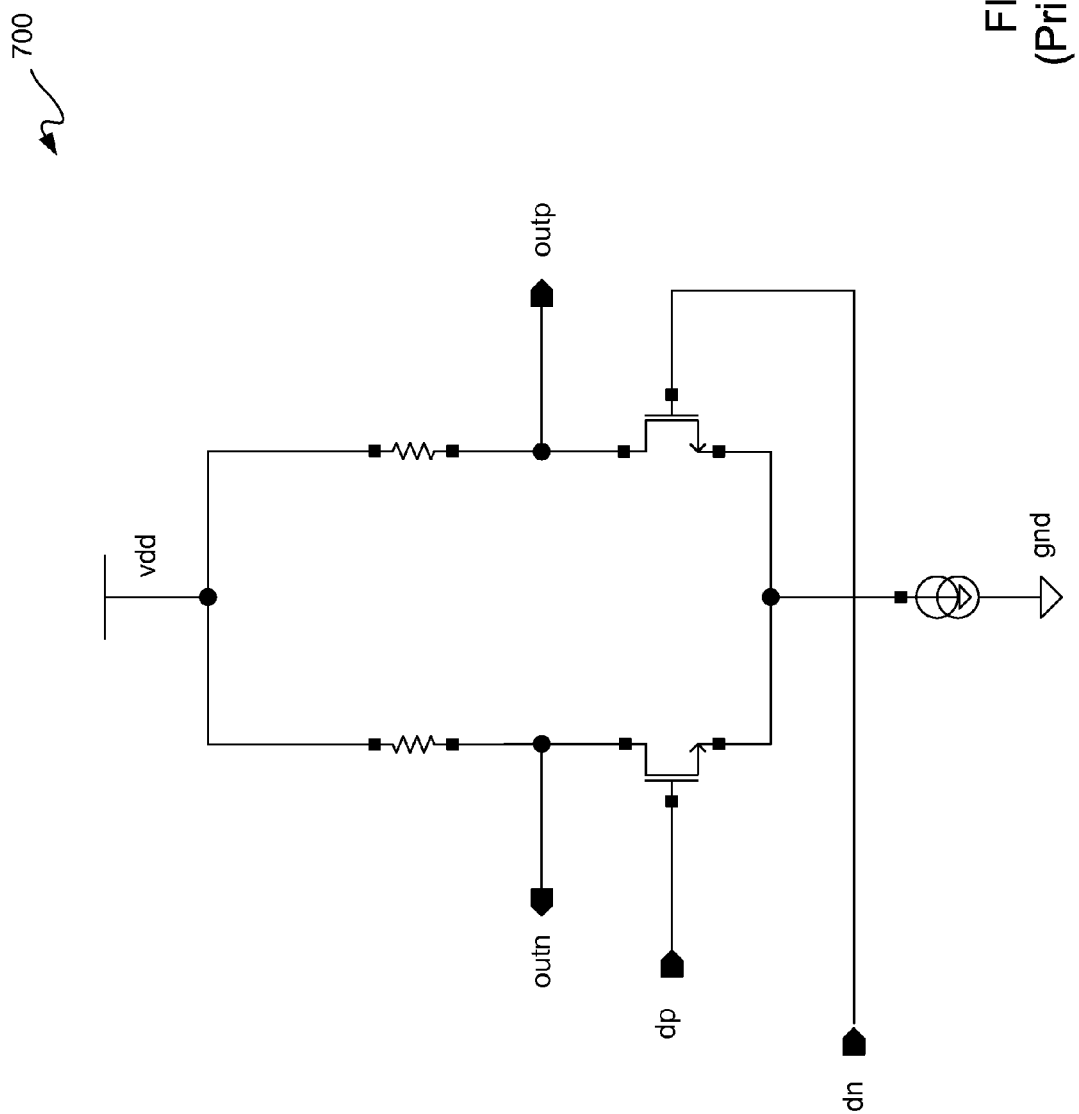
FIG. 7 is a block diagram depicting an exemplary embodiment of a conventional isolation amplifier.

Current source module 803, in contrast to isolation amplifier 700 of FIG. 7, includes two current sources and two current source nodes, namely current source 804 and current source 805, and current source nodes 806 and 807. Current source 804 is coupled between current source node 806 and ground 810, and current source 805 is coupled between current source node 807 and ground 810.

Gain boost circuit 802 is connected at current source nodes 806 and 807 to isolation amplifier circuit 801 and current source module 803. A resistive load and two switch circuits are all coupled in parallel to one another between current source nodes 806 and 807, which current source nodes are also current source nodes of isolation amplifier 801 and current source module 803.

A switch circuit, which in this exemplary embodiment is implemented with an n-type transistor 839, of gain boost circuit 802 has its drain node connected to current source node 806 and its source node connected to current source node 807. Transistor 339 is gated by a high-pass ("hp") control signal 840. Another control signal, namely high-pass bar ("hpB") control signal 841 is provided to a second switch circuit 830. Control signals 840 and 841 are complements of one another and thus only one of such control signals is asserted at a time, as the other control signal would be deasserted.

In a non-gain boost mode, high-pass control signal 840 is asserted and high-pass bar control signal 841 is deasserted or not asserted. In such non-gain boost mode, transistor 839 is put in a substantially conductive state ("ON") responsive to assertion of high-pass control signal 840, namely a logic high in this exemplary embodiment, for electrically coupling current source nodes 806 and 807 to one another. In such non-gain boost mode, switch circuit 830 generally does not affect voltage at current source nodes 806 and 807.

In this exemplary embodiment, switch circuit 830 includes transistors 831 and 832, and capacitor 833. In this exemplary embodiment, transistors 831 and 832 are both n-type transistors. A drain node of transistor 831 is connected to current source node 806, and source node of transistor 831 is connected to one plate of capacitor 833. Another plate of capacitor 833 is connected to a drain node of transistor 832. A source node of transistor 832 is connected to current source node 807. Both of transistors 831 and 832 are gated by high-pass bar signal control signal 841. Thus, in this exemplary embodiment, when high pass control signal 840 is logic high, high-pass bar control signal 841 is logic low. In such non-gain boost mode, transistors 831 and 832 are both in a respective substantially non-conductive state ("OFF") and transistor 839 is ON.

A resistive load, which in this exemplary embodiment is provided by a resistor 835, is connected in parallel with switch circuit 830 and a switch circuit provided by transistor 839. Thus, one node of resistor 835 is connected to current source node 806 and another node of resistor 835 is connected to current source node 807.

In effect, by turning off transistors 831 and 832 and turning on transistor 839, a parallel resistance is formed between the "turn on" or ON resistance of transistor 839 and the resistance of resistors 835. By "turn on" or ON resistance of a transistor, it should be understood that that there is an inherent resistance of a transistor even when ON.

In such a non-gain boost mode, it should be appreciated that isolation amplifier 800 is configured to duplicate function of isolation amplifier 700 of FIG. 7. However, this duplication does include the addition of parallel resistance of ON resistance of transistor 839 in parallel with resistor 835 and an additional a current source, such as either of current sources 804 and 805. However, it should be understood that isolation amplifier 800 in a non-gain boost mode effectively can mimic functionality of isolation amplifier 700 of FIG. 7. Thus, it should be understood that isolation amplifier 800 in a non-gain boost mode is capable of functioning as a limiting amplifier, such as for supporting legacy operations for example.

For a gain boost mode of operation of gain boost circuit 802, high-pass control signal 840 is deasserted or not asserted, and high-pass bar control signal 841 is asserted. In this exemplary embodiment, high-pass bar control signal 841 would be logic high when asserted, and high-pass control signal 840 would be logic low. For high-pass bar control signal 841 being a logic high, transistors 831 and 832 are both ON, and for high pass control signal 840 being logic low, transistor 839 is OFF.

With transistors 831 and 832 both ON, capacitor 833 is connected in series with respect to turn on resistances of transistors 831 and 832, and such series is coupled between current source node 806 and current source node 807. Furthermore, such series of turn on resistances for transistors 831 and 832 and capacitance of capacitor 833 is in parallel with resistor 835.

In a non-gain boost mode, the resistance of resistor 835 in parallel with the turn on resistance of transistor 839 closely approximates a metal short. Thus, in this configuration, gain boost circuit 802 mimics a current source node of isolation amplifier 700 of FIG. 7. However, it should be understood that during high frequency operations, capacitor 833 effectively mimics or at least approximates an AC "short circuit" or AC coupling, namely the reactance and impedance are both close to zero at high frequencies. Accordingly, the series resistance of turn on resistances associated with transistors 831 and 832 in parallel with the resistance of resistor 835 provides an additional boost of gain at high frequency. This boost of gain is obtained from a zero generated from either current source 804 or 805 coupled to resistor 835 respectively at current source nodes 806 and 807.

Referring to FIGS. 5, 6, and 8 in combination, again it should be understood that an isolation amplifier 800 may be implemented as isolation amplifier 601. Again, optionally, another isolation amplifier 800 may be implemented as isolation amplifier 604.

With reference to implementing isolation amplifier 800, namely a dual-mode amplifier, for isolation amplifier 601, both a first stage of equalization by RXAFE amplifier 603 and a second stage of equalization by amplifier 601 operating in a gain boost mode may be used. In other words, the second stage of gain provided by a dual mode isolation amplifier 800 for isolation amplifier 601 enhances or boosts equalization.

In the embodiment of a four-tap DFE 602, such additional gain provided by isolation amplifier 800 when in a gain boost mode avoids the limitation, namely the limiting of RX equalization signal 608 by a conventional isolation amplifier 601, such as illustratively depicted as isolation amplifier 700 of FIG. 7. Furthermore, it should be understood that RX equalization block 600, with at least one dual mode isolation amplifier 800 for isolation amplifier 601, and optionally another dual mode isolation amplifier 800 for isolation amplifier 604, may be used as part of RX equalization and RX CDR, namely programmable equalizer 541 and CDR driver 543 of RC-PMA block 504 of a receive path 502. Again, it should be understood that receive path 502 may be of a GT receiver, and such GT receiver may form part of a SERDES. More particularly, output of RX CDR driver 543 may be provided as a serial input to a SIPO buffer 544.

Accordingly, it should be understood that RX input signal 607 is received by RXAFE amplifier 603 and buffered, for providing an associated gain to provide RX equalization signal 608. A dual mode isolation amplifier 601 is coupled to receive such RX equalization signal 608. Such dual mode isolation amplifier 601 is configured to operate with a first resistor-loaded transconductance with additional gain in one mode of operation and with a second resistor-loaded transconductance without the additional gain in a second mode of operation.

A second dual mode isolation amplifier 604 may optionally be coupled to receive RX equalization signal 608. Such second dual mode isolation amplifier 604 may likewise be configured to operate with the first resistor-loaded transconductance with the additional gain in the first mode of operation and with the second resistor-loaded transconductance without the additional gain in the second mode of operation. Thus, when operating in the first mode of operation, the first dual mode isolation amplifier 601 may provide a first boost of equalization responsive to the additional gain, and likewise the second dual mode isolation amplifier may provide a second boost of equalization responsive to the additional gain when in the first mode of operation. The first boost of equalization provided by the output of the first dual mode isolation amplifier 601 is for taps of DFE 602. More particularly, the first boost of equalization is for input to taps of DFE 602 prior to input to front end sense amplifiers of such DFE. The second boost of equalization provided by the output of dual mode isolation amplifier 604 is for data input to sampling flip-flops 605 and 606 for clock data recovery associated with DFE 602.

It should be understood that RX equalization block 600 having at least one dual mode isolation amplifier 601 may be implemented as part of a GT, such as GT 500 of FIG. 5. Furthermore, it should be understood that GT 500 may be a primitive of an FPGA, namely a hard macro of an FPGA which may be grouped, as described elsewhere herein.

Figure 9:
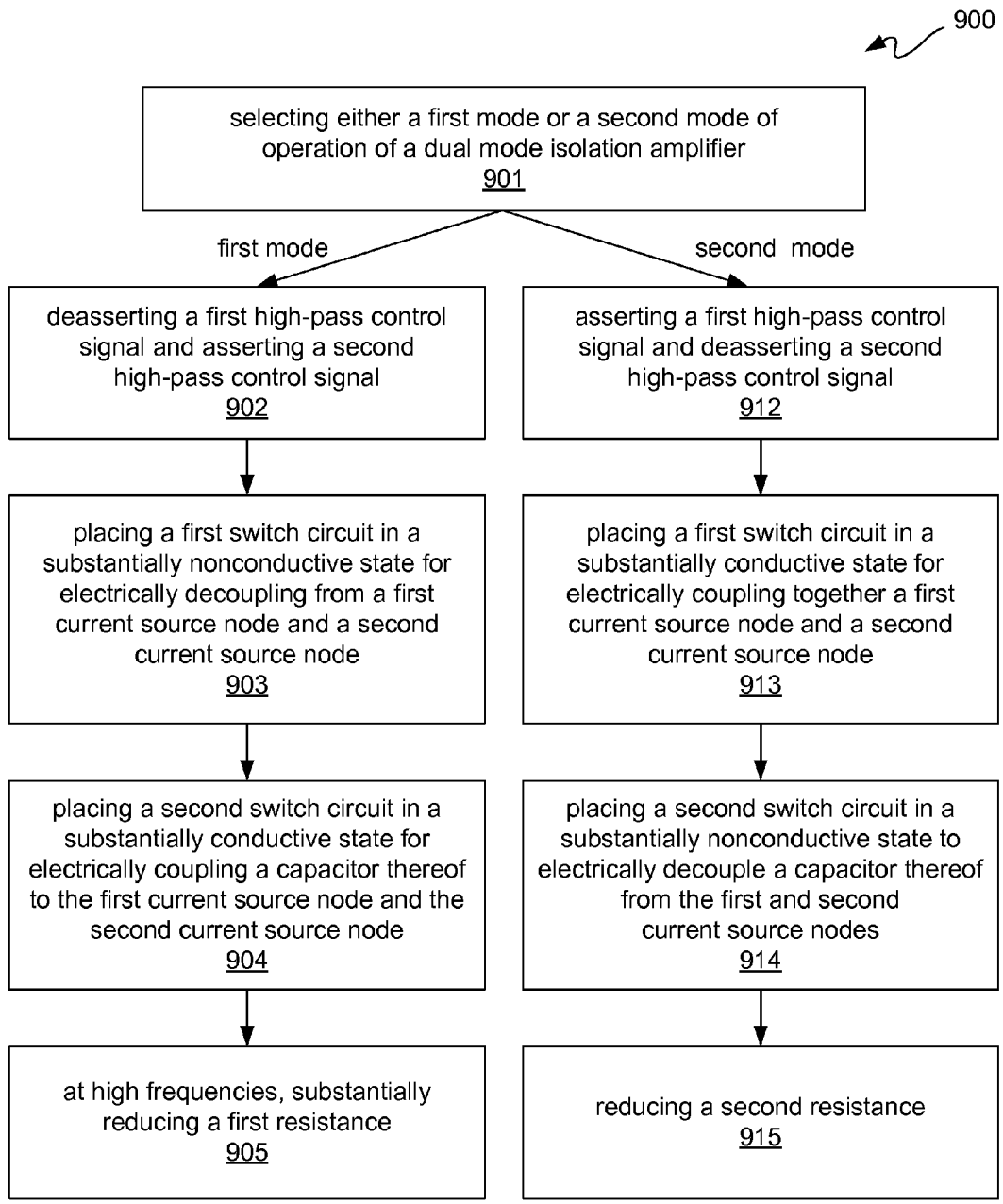
FIG. 9 is a flow diagram depicting an exemplary embodiment of a dual mode isolation amplifier flow.

FIG. 9 is a flow diagram depicting an exemplary embodiment of a dual mode isolation amplifier flow 900. At 901, either a first mode or a second mode of operation of a dual mode isolation amplifier is selected.

If the first mode is selected, a first high-pass control signal is deasserted and a second high-pass control signal is asserted at 902. At 903, a first switch circuit is placed in a substantially non-conductive state for electrically decoupling from a first current source node and a second current source node. At 904, a second switch circuit is placed in a substantially conductive state for electrically coupling a capacitor thereof to the first current source node and the second current source node. It should be understood that operations at 903 and 904 may be performed concurrently.

Responsive to the operations at 904, at 905, a first resistance is associated with a capacitor coupled in parallel with a resistive load. The resistive load is coupled between the first current source node and the second current source node, and the capacitor is electrically coupled between the first current source node and the second current source node. For high-frequency operation, the first resistance is substantially reduced at 905 for providing an additional boost of gain.

If, at 901, a second mode of operation is selected, then at 912, the first high-pass control signal is asserted and the second high-pass control signal is deasserted. At 913, the first switch circuit is placed in a substantially conductive state for electrically coupling together the current source node and the second current source node. At 914, a second switch circuit is placed in a substantially non-conductive state for electrically decoupling the capacitor thereof from the first and second current source nodes. Operations at 913 and 914 may be performed concurrently.

In response to placing the first switch circuit in a substantially conductive state at 913, at 915, a second resistance in parallel with the resistive load is reduced. In other words, the resistive load which is coupled between the first and second current source nodes is effectively short-circuited.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for amplification, comprising:
providing a dual mode isolation amplifier having a first mode of operation and a second mode of operation;
in the first mode of operation, operating with a resistor-loaded differential transconductance with additional gain by:
deasserting a first high-pass control signal and asserting a second high-pass control signal;
placing a first switch circuit in a substantially nonconductive state for electrically decoupling from a first current source node and a second current source node;
placing a second switch circuit in a substantially conductive state for electrically coupling a capacitor thereof to the first current source node and the second current source node; and
at high frequencies, substantially reducing a first resistance associated with the capacitor coupled in parallel with a resistive load, the resistive load coupled between the first current source node and the second current source node;
wherein the first resistance is reduced by approximating a short circuit by the capacitor during high-frequency operation.

2. The method according to claim 1, further comprising:
in the second mode of operation, operating with the resistor-loaded differential transconductance without the additional gain by:
asserting the first high-pass control signal and deasserting the second high-pass control signal;
placing the first switch circuit in a substantially conductive state for electrically coupling the first current source node and the second current source node;
placing the second switch circuit in a substantially non-conductive state for electrically decoupling the capacitor from the first current source node and the second current source node; and
at least approximating a metal short for a second resistance;
wherein the second resistance is a parallel resistance of a turn-on resistance of the first switch circuit in parallel with the resistive load.

3. The method according to claim 2, wherein:
the placing of the first switch circuit in the substantially nonconductive state thereof includes putting a first transistor in the substantially nonconductive state; and
the placing of the second switch circuit in the substantially conductive state thereof includes putting a second transistor and a third transistor in the substantially conductive state.

4. The method according to claim 2, wherein:
the placing of the first switch circuit in the substantially conductive state thereof includes putting a first transistor in the substantially conductive state; and
the placing of the second switch circuit in the substantially nonconductive state thereof includes putting a second transistor and a third transistor in the substantially nonconductive state.

5. The method according to claim 2, wherein:
the first mode of operation is for functioning as a limiting amplifier with the additional gain; and
the second mode of operation is for functioning as the limiting amplifier without the additional gain.

6. An apparatus for amplification, comprising:
a isolation amplifier circuit;
a gain boost circuit coupled to the isolation amplifier circuit at a first current source node and a second current source node; and
a current source module coupled to the isolation amplifier circuit and the gain boost circuit at the first current source node and the second current source node
wherein the gain boost circuit includes:
a first switch circuit coupled to receive a first high-pass control signal;
a second switch circuit coupled to receive a second high-pass control signal; and
a first resistive load coupled in parallel with the first switch circuit and the second switch circuit between the first current source node and the second current source node;
wherein the second switch circuit includes a capacitor;
wherein the second high-pass control signal is complementary with respect to the first high pass signal; and
wherein the first switch circuit and the second switch circuit are coupled in parallel with respect to one another between the first current source node and the second current source node.

7. The apparatus according to claim 6, wherein:
the resistive load includes a first resistor;
the first switch circuit includes a first transistor coupled to receive the first high-pass control signal at a gate thereof; and
the first transistor has a first source/drain node coupled to the first current source node and has a second source/drain node coupled to the second current source node.

8. The apparatus according to claim 7, wherein:
the second switch circuit includes a second transistor and a third transistor coupled to receive the second high-pass control signal at respective gates thereof;
the second transistor has a first source/drain node coupled to the first current source node and has a second source/drain node coupled to a first plate of the capacitor; and
the third transistor has a first source/drain node coupled to the second current source node and has a second source/drain node coupled to a second plate of the capacitor.

9. The apparatus according to claim 8, wherein:
the current source module includes a first current source coupled between the first current source node and a ground node;
the current source module further includes a second current source coupled between the second current source node and the ground node.

10. The apparatus according to claim 9, wherein:
the isolation amplifier circuit includes a fourth transistor, a fifth transistor, a second resistor, and a third resistor;
the fourth transistor is coupled to receive a first data signal at a gate thereof;
the fifth transistor is coupled to receive a second data signal at a gate thereof;
the first data signal is complementary with respect to the second data signal;
a first source/drain node of the fourth transistor is coupled to the first current source node;
a second source/drain node of the fourth transistor is coupled to a first output node;
a first source/drain node of the fifth transistor is coupled to the second current source node;
a second source/drain node of the fifth transistor is coupled to a second output node;
the second resistor is coupled between the first output node and a supply voltage node;
the third resistor is coupled between the second output node and the supply voltage node; and
a first output sourced from the first output node is complementary with respect to a second output sourced from the second output node.

* * * * *